United States Patent
Imai et al.

(10) Patent No.: US 11,862,689 B2
(45) Date of Patent: Jan. 2, 2024

(54) GROUP-III ELEMENT NITRIDE SEMICONDUCTOR SUBSTRATE

(71) Applicant: NGK INSULATORS, LTD., Nagoya (JP)

(72) Inventors: Katsuhiro Imai, Nagoya (JP); Masahiro Sakai, Nagoya (JP); Hiroki Kobayashi, Nagoya (JP)

(73) Assignee: NGK INSULATORS, LTD., Nagoya (JP)

( * ) Notice: Subject to any disclaimer, the term of this patent is extended or adjusted under 35 U.S.C. 154(b) by 0 days.

(21) Appl. No.: 18/170,819

(22) Filed: Feb. 17, 2023

(65) Prior Publication Data

US 2023/0282711 A1 Sep. 7, 2023

Related U.S. Application Data

(63) Continuation of application No. PCT/JP2021/016074, filed on Apr. 20, 2021.

(30) Foreign Application Priority Data

Sep. 17, 2020 (JP) .................................. 2020-156017

(51) Int. Cl.
*H01L 21/02* (2006.01)
*H01L 29/20* (2006.01)
(Continued)

(52) U.S. Cl.
CPC ...... *H01L 29/2003* (2013.01); *H01L 21/0237* (2013.01); *H01L 21/0242* (2013.01);
(Continued)

(58) Field of Classification Search
CPC ............. H01L 21/0242; H01L 21/0243; H01L 21/0254; H01L 21/02433; H01L 21/02389; H01L 21/0237
See application file for complete search history.

(56) References Cited

U.S. PATENT DOCUMENTS 7,045,808 B2 5/2006 Shibata
7,825,409 B2 11/2010 Fujita et al.
(Continued)

FOREIGN PATENT DOCUMENTS

JP 10256195 A 9/1998
JP 2005263609 A 9/2005
(Continued)

OTHER PUBLICATIONS

English Translation of the International Preliminary Report on Patentability, issued in corresponding International Application No. PCT/JP2021/016074, dated Mar. 30, 2023 (6 pages).
(Continued)

*Primary Examiner* — Mohsen Ahmadi

(74) *Attorney, Agent, or Firm* — FLYNN THIEL, P.C.

(57) ABSTRACT

Group-III element nitride semiconductor substrate including a first surface and a second surface that are easy to visually distinguish from each other. An end portion is easily detected with an optical sensor, a large effective area (area that can be used in device production) can be secured, and warping of the entirety of the substrate is reduced. A Group-III element nitride semiconductor substrate includes a first surface; and a second surface, wherein the first surface is a mirror surface, the second surface has a second-surface central region and a second-surface outer peripheral region, the second-surface central region is a mirror surface, and the second-surface outer peripheral region is a non-mirror surface.

9 Claims, 5 Drawing Sheets

(51) Int. Cl.
*H01L 29/06* (2006.01)
*H01L 21/304* (2006.01)

(52) U.S. Cl.
CPC ...... *H01L 21/0243* (2013.01); *H01L 21/0254* (2013.01); *H01L 21/02389* (2013.01); *H01L 21/02433* (2013.01); *H01L 21/304* (2013.01); *H01L 29/0657* (2013.01)

(56) References Cited

U.S. PATENT DOCUMENTS

| | | | |
|---|---|---|---|
| 8,486,813 | B2 | 7/2013 | Park |
| 9,006,865 | B2 | 4/2015 | Ikuta et al. |
| 10,269,554 | B2 | 4/2019 | Sasaki et al. |
| 11,101,404 | B2 | 8/2021 | Miyamoto et al. |
| 2005/0104162 | A1* | 5/2005 | Xu ............... C30B 29/403 257/E29.004 |
| 2005/0274975 | A1* | 12/2005 | Shibata ............ C30B 29/64 257/E29.089 |
| 2007/0131967 | A1 | 6/2007 | Kawaguchi et al. |
| 2011/0068434 | A1* | 3/2011 | Yamaguchi ........ C30B 29/406 83/13 |
| 2011/0215440 | A1* | 9/2011 | Fujiwara ............ C30B 9/04 257/E29.089 |
| 2012/0282443 | A1* | 11/2012 | Fujito ............. C01B 21/0632 117/88 |
| 2013/0022773 | A1* | 1/2013 | Aida ............... H01L 21/02658 117/97 |
| 2014/0284660 | A1* | 9/2014 | Makino ............ H01L 21/02002 257/190 |
| 2016/0329419 | A1* | 11/2016 | Ogawa ............. H01L 29/66462 |

FOREIGN PATENT DOCUMENTS

| | | |
|---|---|---|
| JP | 2007153712 A | 6/2007 |
| JP | 2007297263 A | 11/2007 |
| JP | 201087512 A | 4/2010 |
| JP | 2011121803 A | 6/2011 |
| JP | 2012142485 A | 7/2012 |
| JP | 5796642 B2 | 5/2014 |
| JP | 201632002 A | 3/2016 |
| JP | 2019176124 A | 10/2019 |
| WO | 2011161975 A1 | 12/2011 |

OTHER PUBLICATIONS

International Search Report with English Translation issued in corresponding International Application No. PCT/JP2021/016074 dated Jun. 29, 2021 (6 pages).

Written Opinion of International Searching Authority issued in corresponding International Application No. PCT/JP2021/016074 dated Jun. 29, 2021 (4 pages).

Chinese Office Action with English translation issued in corresponding Chinese Application No. 202180054548.2 dated Jun. 2, 2023 (15 pages).

* cited by examiner

GROUP-III ELEMENT NITRIDE SEMICONDUCTOR SUBSTRATE

CROSS-REFERENCE TO RELATED APPLICATIONS

This is a continuation of International Application PCT/JP2021/016074 filed on Apr. 20, 2021, which claims priority from Japanese Application No. 2020-156017 filed on Sep. 17, 2020, both of which are hereby incorporated by reference in their entireties.

BACKGROUND OF THE INVENTION

1. Field of the Invention

The present invention relates to a Group-III element nitride semiconductor substrate, and more specifically, to a Group-III element nitride semiconductor substrate of such a type that both of its front and back surfaces are mirror surfaces, the Group-III element nitride semiconductor substrate including a first surface and a second surface, in which only an outer peripheral region of the second surface is subjected to non-mirror finish.

2. Description of the Related Art

Group-III element nitride semiconductor substrates, such as a gallium nitride (GaN) wafer, an aluminum nitride (AlN) wafer, and an indium nitride (InN) wafer, have been used as the substrates of various semiconductor devices (e.g., Patent Literature 1).

A semiconductor substrate includes a first surface and a second surface. When the first surface is defined as a main surface, and the second surface is defined as a back surface, the main surface is generally subjected to mirror finish. Meanwhile, the back surface is subjected to mirror finish or rough finish in accordance with applications (e.g., Patent Literatures 2 to 4).

When the back surface is subjected to mirror finish, both of the main surface and the back surface become mirror surfaces, and hence it becomes difficult to visually distinguish the main surface and the back surface from each other. Accordingly, the main surface and the back surface have been visually distinguished from each other by forming a secondary orientation flat in addition to a primary orientation flat.

However, when the secondary orientation flat is formed in addition to the primary orientation flat, there occurs a problem in that the effective area (area that can be used in device production) of the semiconductor substrate reduces.

In addition, in an automated production process for the semiconductor substrate, the end portion of the semiconductor substrate is detected with an optical sensor. In this case, when the semiconductor substrate is transparent, and the back surface is subjected to mirror finish, measurement light substantially passes through the semiconductor substrate, and hence the amount of a change between the quantity of the light to be output from a light source and the quantity of the light to be input to a detector may become so small as not to be detected with the optical sensor. Accordingly, there occurs a problem in that an error in the detection of the end portion of the semiconductor substrate is liable to occur, and hence the automated production process stops.

Meanwhile, when the back surface is subjected to rough finish, it is easy to visually distinguish the main surface and the back surface from each other, and such error in the detection of the end portion with the optical sensor as described above hardly occurs. However, there occurs a problem in that warping is liable to occur in the entirety of the substrate. This is probably because the physical surface states of the main surface and the back surface differ from each other (e.g., Patent Literatures 3 and 4). At the time of the production of various devices through use of the semiconductor substrate, the warping is desirably as small as possible from the viewpoint of suppressing the operation failure of a production process apparatus. Here, examples of the operation failure include the thickness variation of a film-forming device, the focus shift of an exposing device for a semiconductor circuit, and the adsorption failure of a transferring device.

CITATION LIST

Patent Literature

[PTL 1] JP 2005-263609 A
[PTL 2] JP 2007-153712 A
[PTL 3] JP 2007-297263 A
[PTL 4] JP 5796642 B2

SUMMARY OF THE INVENTION

An object of the present invention is to provide such a Group-III element nitride semiconductor substrate including a first surface and a second surface that it is easy to visually distinguish the first surface and the second surface from each other, that an end portion is easily detected with an optical sensor, that a large effective area (area that can be used in device production) can be secured, and that the warping of the entirety of the substrate is reduced.

To achieve the object of the present invention, unconventional new substrate design is required in a Group-III element nitride semiconductor substrate including a first surface and a second surface. When the first surface is defined as a main surface, and the second surface is defined as a back surface, possible design for reducing the warping of the substrate is, for example, design in which the physical surface states of the main surface and the back surface are made as identical as possible to each other, specifically, design in which both of the main surface and the back surface are turned into mirror surfaces. However, when the back surface is turned into a mirror surface, an error in the detection of the end portion of the substrate with an optical sensor is liable to occur. In addition, when the design in which the physical surface states of the main surface and the back surface are made as identical as possible to each other is performed, some distinction points need to be arranged on the main surface and the back surface for visually distinguishing the main surface and the back surface from each other with ease. Secondary orientation flats have heretofore been formed as the distinction points, but the effective area (area that can be used in device production) of the substrate reduces. Accordingly, another distinction means needs to be established.

The inventors of the present invention have investigated such new substrate design as described above. As a result, in a Group-III element nitride semiconductor substrate including a first surface and a second surface, when the first surface is defined as a main surface, and the second surface is defined as a back surface, the inventors have paid attention to the outer peripheral region of the back surface, and have conceived that the above-mentioned object can be achieved by providing a substrate of such a type that both of its front and back surfaces are mirror surfaces in which only the outer peripheral region of the back surface is subjected to non-mirror finish. Thus, the inventors have completed the present invention.

A Group-III element nitride semiconductor substrate according to embodiments of the present invention includes: a first surface; and a second surface, wherein the first surface is a mirror surface, wherein the second surface has a second-surface central region and a second-surface outer peripheral region, wherein the second-surface central region is a mirror surface, and wherein the second-surface outer peripheral region is a non-mirror surface.

In one embodiment, the second-surface outer peripheral region has a width of 5 mm or less.

In one embodiment, the second-surface outer peripheral region has a width of 3 mm or less.

In one embodiment, the second-surface outer peripheral region has a width of 1 mm or less.

In one embodiment, the second-surface outer peripheral region has a surface roughness Ra of 100 nm or more.

In one embodiment, the second-surface central region has a surface roughness Ra of 10 nm or less.

In one embodiment, the first surface has a surface roughness Ra of 1 nm or less.

In one embodiment, the second-surface outer peripheral region is a light-shielding region configured to attenuate laser light having a wavelength of 650 nm by 10% or more.

In one embodiment, the substrate has a warping of 50 μm or less.

In one embodiment, the substrate has a radius of curvature of 30 m or more.

In one embodiment, the substrate is free of any secondary orientation flat.

In one embodiment, the substrate has a diameter of 95 mm or more.

In one embodiment, the substrate has a diameter of 145 mm or more.

BRIEF DESCRIPTION OF THE DRAWINGS

FIGS. 5A, 5B and 5C are schematic explanatory views for illustrating a method of producing the Group-III element nitride semiconductor substrate according to the embodiment of the present invention, in which FIG. 5A illustrates a seed crystal film formed on a base substrate and a Group-III element nitride layer formed on the seed crystal film, FIG. 5B illustrates a freestanding substrate and FIG. 5C illustrates a functional element.

DESCRIPTION OF THE EMBODIMENTS

Figure 1:
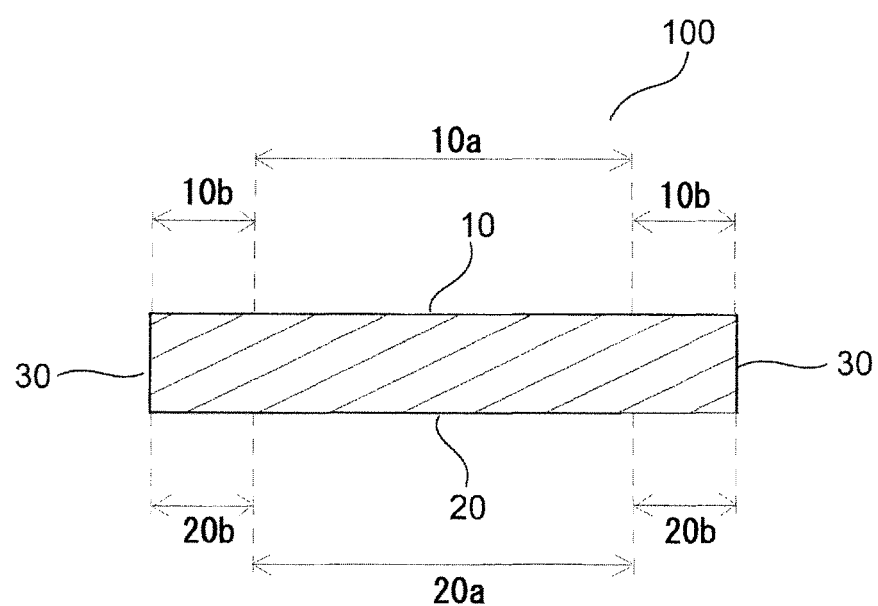
FIG. 1 is a typical schematic sectional view of a Group-III element nitride semiconductor substrate according to an embodiment of the present invention.

When the expression "weight" is used herein, the expression may be replaced with "mass" that is commonly used as an SI unit representing a weight.

A Group-III element nitride semiconductor substrate according to an embodiment of the present invention is typically a freestanding substrate formed of a Group-III element nitride crystal. In the description of the present invention, the term "freestanding substrate" means a substrate that is not deformed or broken by its own weight at the time of its handling, and hence can be handled as a solid. The freestanding substrate may be used as each of the substrates of various semiconductor devices, such as a light-emitting device and a power-controlling device.

The Group-III element nitride semiconductor substrate according to the embodiment of the present invention is typically a wafer shape (substantially complete round shape). When the Group-III element nitride semiconductor substrate according to the embodiment of the present invention is a wafer shape, its size is as follows: its diameter is preferably from mm to 310 mm, and is typically, for example, 25 mm (about 1 inch), from 45 mm to 55 mm (about 2 inches), from 95 mm to 105 mm (about 4 inches), from 145 mm to 155 mm (about 6 inches), from 195 mm to 205 mm (about 8 inches), or from 295 mm to 305 mm (about 12 inches). Such size facilitates the application of the Group-III element nitride semiconductor substrate according to the embodiment of the present invention to a production process for a semiconductor package. The substrate may be processed into any other shape such as a rectangular shape as required.

The thickness of the Group-III element nitride semiconductor substrate according to the embodiment of the present invention (when the thickness is not constant, the thickness of a site having the largest thickness) is preferably from 300 μm to 1,000 μm.

Typical examples of the Group-III element nitride include gallium nitride (GaN), aluminum nitride (AlN), indium nitride (InN), and a mixed crystal thereof. Those nitrides may be used alone or in combination thereof.

The Group-III element nitride is specifically GaN, AlN, InN, $Ga_xAl_{1-x}N$ (1>x>0), $Ga_xIn_{1-x}N$ (1>x>0), $Al_xIn_{1-x}N$ (1>x>0), or $Ga_xAl_yIn_zN$ (1>x>0, 1>y>0, x+y+z=1). Those nitrides may be doped with various n-type dopants or p-type dopants.

Typical examples of the p-type dopant include beryllium (Be), magnesium (Mg), strontium (Sr), and cadmium (Cd). Those dopants may be used alone or in combination thereof.

Typical examples of the n-type dopant include silicon (Si), germanium (Ge), tin (Sn), and oxygen (O). Those dopants may be used alone or in combination thereof.

The plane direction of the Group-III element nitride semiconductor substrate may be set to any one of a c-plane, an m-plane, an a-plane, and a specific crystal plane tilted from each of the c-plane, the a-plane, and the m-plane, and particularly when the plane direction is set to the c-plane, the effects of the present invention are expressed to a larger extent. Examples of the specific crystal plane tilted from each of the c-plane, the a-plane, and the m-plane may include so-called semipolar planes, such as a {11-22} plane and a {20-21} plane. In addition, the plane direction is permitted to include not only a so-called just plane vertical to the c-plane, the a-plane, the m-plane, or the specific crystal plane tilted from each of the planes but also an off angle in the range of ±5°.

The Group-III element nitride semiconductor substrate according to the embodiment of the present invention is a Group-III element nitride semiconductor substrate including a first surface and a second surface, wherein the first surface is a mirror surface, wherein the second surface has a second-surface central region and a second-surface outer peripheral region, wherein the second-surface central region is a mirror surface, and wherein the second-surface outer peripheral region is a non-mirror surface.

In the Group-III element nitride semiconductor substrate according to the embodiment of the present invention, when the first surface is defined as a main surface, and the second surface is defined as a back surface, as long as the plane direction of the Group-III element nitride semiconductor substrate is the c-plane, the main surface is typically a Group-III element polar surface, and the back surface is typically a nitrogen polar surface. However, various devices may be produced on the nitrogen polar surface depending on applications, and hence the main surface may be set to the nitrogen polar surface, and the back surface may be set to the Group-III element polar surface. The various devices may be implemented on the main surface, and an epitaxial crystal may be grown thereon. The back surface may be held with a susceptor or the like to transfer the Group-III element nitride semiconductor substrate according to the embodiment of the present invention.

In the description of the Group-III element nitride semiconductor substrate according to the embodiment of the present invention, the first surface is described as the main surface, and the second surface is described as the back surface. Accordingly, in this description, the term "main surface" may be replaced with "first surface," the term "first surface" may be replaced with "main surface," the term "back surface" may be replaced with "second surface," and the term "second surface" may be replaced with "back surface."

FIG. 1 is a typical schematic sectional view of the Group-III element nitride semiconductor substrate according to the embodiment of the present invention.

As illustrated in FIG. 1, a Group-III element nitride semiconductor substrate 100 according to the embodiment of the present invention typically includes a main surface 10 and a back surface 20 that are in a two-sided relationship, and a side surface 30, the main surface 10 has a main-surface central region 10a and a main-surface outer peripheral region 10b, and the back surface 20 has a back-surface central region 20a and a back-surface outer peripheral region 20b.

Although the main surface 10 has the main-surface central region 10a and the main-surface outer peripheral region in FIG. 1, the main surface may be free of any main-surface central region and any main-surface outer peripheral region unlike this example.

Any appropriate form may be adopted as the end portion of the Group-III element nitride semiconductor substrate according to the embodiment of the present invention to the extent that the effects of the present invention are not impaired. That is, the end-portion sectional shape of the Group-III element nitride semiconductor substrate according to the embodiment of the present invention is not limited to such a rectangular shape as illustrated in FIG. 1, and for example, the shape may be a shape in which both of the main surface side and back surface side of the end portion are chamfered so as to be flat surfaces (FIG. 2A), may be a shape chamfered in an R-shape (FIG. 2B), may be a shape in which only the main surface side of the end portion is chamfered so as to be a flat surface (FIG. 2C), or may be a shape in which only the back surface side of the end portion is chamfered so as to be a flat surface (FIG. 2D). In the Group-III element nitride semiconductor substrate 100 according to an embodiment of the present invention illustrated in FIG. 2A, the main surface side and back surface side of its end portion are chamfered to arrange a main surface-side chamfered portion 11 and a back surface-side chamfered portion 21. In the Group-III element nitride semiconductor substrate 100 according to an embodiment of the present invention illustrated in FIG. 2B, the main surface-side chamfered portion 11 and the back surface-side chamfered portion 21 each become a curved surface chamfered in an R-shape, and the respective curved surfaces assemble on the outer peripheral edge of the substrate, and hence no flat side surface remains. In the Group-III element nitride semiconductor substrate 100 according to an embodiment of the present invention illustrated in FIG. 2C, the main surface has the main surface-side chamfered portion 11, the back surface is free of any back surface-side chamfered portion, the main surface-side chamfered portion 11 becomes a flat surface, the flat surface is tilted with respect to the main surface 10, the back surface 20, and the side surface 30, and the side surface 30 is a flat surface. In the Group-III element nitride semiconductor substrate 100 according to an embodiment of the present invention illustrated in FIG. 2D, the back surface has the back surface-side chamfered portion 21, the main surface is free of any main surface-side chamfered portion, the back surface-side chamfered portion 21 becomes a flat surface, the flat surface is tilted with respect to the main surface 10, the back surface 20, and the side surface 30, and the side surface 30 is a flat surface. The end portion of the Group-III element nitride semiconductor substrate according to the embodiment of the present invention is of course not limited to the forms illustrated in FIG. 2A to FIG. 2D.

The main surface-side chamfered portion 11 may be arranged over the entirety (one entire round) of the main-surface outer peripheral region 10b, or may be arranged only in part of the main-surface outer peripheral region 10b. From, for example, the viewpoint of suppressing the chipping of the semiconductor substrate, the main surface-side chamfered portion 11 is preferably arranged over the entirety (one entire round) of the main-surface outer peripheral region 10b.

The back surface-side chamfered portion 21 may be arranged over the entirety (one entire round) of the back-surface outer peripheral region 20b, or may be arranged only in part of the back-surface outer peripheral region 20b. From, for example, the viewpoint of suppressing the chipping of the semiconductor substrate, the back surface-side chamfered portion 21 is preferably arranged over the entirety (one entire round) of the back-surface outer peripheral region 20b.

In the Group-III element nitride semiconductor substrate according to the embodiment of the present invention, the main surface is a mirror surface. That is, when the main surface 10 has the main-surface central region 10a and the main-surface outer peripheral region 10b as illustrated in FIG. 1, both of the main-surface central region 10a and the main-surface outer peripheral region 10b become mirror surfaces.

In the Group-III element nitride semiconductor substrate according to the embodiment of the present invention, the back surface has the back-surface central region and the back-surface outer peripheral region, the back-surface central region is a mirror surface, and the back-surface outer peripheral region is a non-mirror surface. That is, in FIG. 1, the back-surface central region 20a is a mirror surface, and the back-surface outer peripheral region 20b is a non-mirror surface.

Figure 2A:
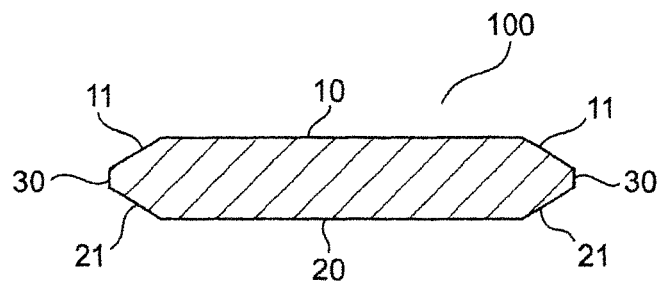
FIG. 2A is a schematic sectional view of a Group-III element nitride semiconductor substrate according to an embodiment of the present invention, the substrate having an end portion different from that of the embodiment illustrated in FIG. 1, in which both the main surface side and the back surface side of the end portion are chamfered.
Figure 2B:
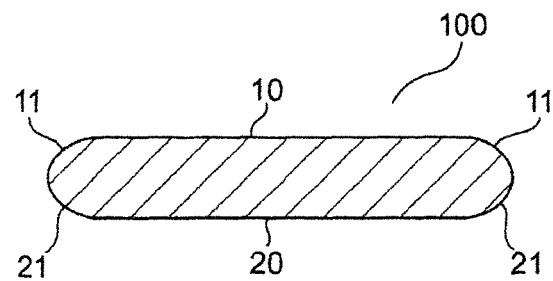
FIG. 2B is a schematic sectional view of a Group-III element nitride semiconductor substrate according to an embodiment of the present invention, the substrate having an end portion different from that of the embodiment illustrated in FIG. 1, in which both the main surface side chamfered portion and the back surface side chamfered portion are curved.
Figure 2C:
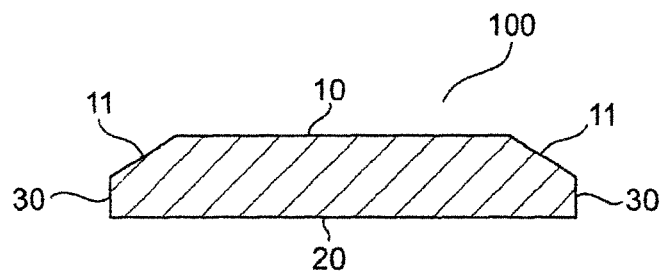
FIG. 2C is a schematic sectional view of a Group-III element nitride semiconductor substrate according to an embodiment of the present invention, the substrate having an end portion different from that of the embodiment illustrated in FIG. 1, in which only the main surface side of the end portion is chamfered.
Figure 2D:
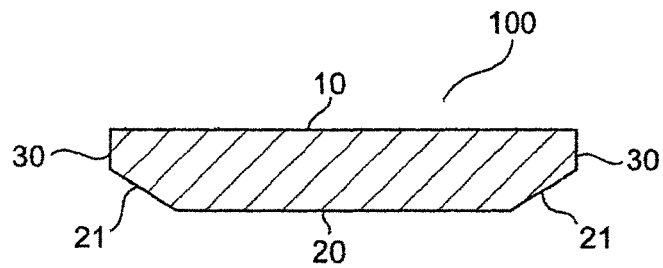
FIG. 2D is a schematic sectional view of a Group-III element nitride semiconductor substrate according to an embodiment of the present invention, the substrate having an end portion different from that of the embodiment illustrated in FIG. 1, in which only the back surface side of the end portion is chamfered.

In the case where the Group-III element nitride semiconductor substrate according to the embodiment of the present invention has a shape in which the back surface side is chamfered so as to be a flat surface as illustrated in, for example, FIG. 2A, FIG. 2B, or FIG. 2D, the back surface-side chamfered portion may coincide with the back-surface outer peripheral region of the back surface. That is, in FIG. 2A, FIG. 2B, or FIG. 2D, the back surface-side chamfered portion 21 may coincide with the back-surface outer peripheral region 20b. Also in this case, the back-surface outer peripheral region 20b is a non-mirror surface, and hence the back surface-side chamfered portion 21 is also a non-mirror surface.

As described above, in the Group-III element nitride semiconductor substrate according to the embodiment of the present invention, the main surface is a mirror surface, the back-surface central region is a mirror surface, and the back-surface outer peripheral region is a non-mirror surface. That is, in the main surface and back surface of the Group-III element nitride semiconductor substrate according to the embodiment of the present invention, only the back-surface outer peripheral region is a non-mirror surface, and the other regions are mirror surfaces. The Group-III element nitride semiconductor substrate according to the embodiment of the present invention is a Group-III element nitride semiconductor substrate of such a type that both of its front and back surfaces are mirror surfaces in which only the back-surface outer peripheral region is subjected to non-mirror finish as described above. Accordingly, it is easy to visually distinguish the main surface and the back surface from each other, the end portion of the substrate is easily detected with an optical sensor, and the warping of the entirety of the substrate is reduced. In addition, it becomes easy to visually distinguish the main surface and the back surface from each other, and hence there is no need to form a secondary orientation flat. Thus, a large effective area (area that can be used in device production) of the semiconductor substrate can be secured.

The term "mirror surface" refers to a surface subjected to mirror processing, the surface being brought into a state in which the roughness and waviness of the surface are reduced to such an extent that light is reflected after the mirror processing, and hence the fact that an object is reflected on the surface subjected to the mirror processing can be visually observed. In other words, the term refers to a surface in a state in which the magnitude of each of the roughness and waviness of the surface after the mirror processing is reduced to such an extent as to be sufficiently negligible with respect to the wavelength of visible light. An epitaxial crystal can be sufficiently grown on the surface subjected to the mirror processing.

Any appropriate method may be adopted as a method for the mirror processing to the extent that the effects of the present invention are not impaired. An example of such method is a method including performing the mirror processing through use of one, or a combination of two or more, of the following apparatus: a polishing apparatus using a tape; a lapping apparatus using diamond abrasive grains; and a chemical mechanical polish (CMP) apparatus using a slurry such as colloidal silica and a polishing pad made of a nonwoven fabric.

The term "non-mirror surface" refers to a surface that is not subjected to mirror processing, and a typical example thereof is a rough surface obtained by surface-roughening treatment.

Any appropriate method may be adopted as a method for the surface-roughening treatment to the extent that the effects of the present invention are not impaired. Examples of such method include: laser texture processing; etching treatment including using various chemicals and gases; physical or chemical coating treatment; and texturing by machining.

The surface roughness Ra of the back-surface outer peripheral region is preferably 100 nm or more, more preferably from 200 nm to 1,500 nm, still more preferably from 500 nm to 1,000 nm. When the surface roughness Ra of the back-surface outer peripheral region is adjusted within the ranges, it becomes easier to visually distinguish the main surface and back surface of the semiconductor substrate from each other, and the end portion thereof is more easily detected with the optical sensor. However, a case in which the surface roughness Ra of the back-surface outer peripheral region becomes excessively large is not preferred because damage to the semiconductor substrate becomes larger to be responsible for a crack.

The surface roughness Ra of the back-surface central region is preferably 10 nm or less, more preferably from 0.1 nm to 2 nm, still more preferably from 0.1 nm to 1 nm, particularly preferably from 0.1 nm to 0.5 nm. When the surface roughness Ra of the back-surface central region is adjusted within the ranges, it becomes easier to visually distinguish the main surface and the back surface from each other, the end portion is more easily detected with the optical sensor, and the warping of the semiconductor substrate can be suppressed.

The surface roughness Ra of the main surface is preferably 2 nm or less, more preferably 1 nm or less, still more preferably from 0.1 nm to 0.5 nm, particularly preferably from 0.1 nm to 0.2 nm. When the surface roughness Ra of the main surface is adjusted within the ranges, it becomes easier to visually distinguish the main surface and the back surface from each other, and the end portion is more easily detected with the optical sensor.

The physical surface states of the main surface and back surface of the Group-III element nitride semiconductor substrate according to the embodiment of the present invention are close to each other, and hence the warping of the substrate is small, preferably 50 μm or less, more preferably 40 μm or less, still more preferably 30 μm or less. When the warping of the substrate is more than 50 μm, at the time of the production of various devices through use of the semiconductor substrate, a production failure due to the thickness variation of a film-forming device or the focus shift of an exposing device for a semiconductor circuit may occur.

The physical surface states of the main surface and back surface of the Group-III element nitride semiconductor substrate according to the embodiment of the present invention are close to each other. Accordingly, the warping of the substrate is small, and the radius of curvature thereof is preferably 30 m or more, more preferably 50 m or more, still more preferably 70 m or more, particularly preferably 100 m or more. When the radius of curvature is less than 30 m, at the time of the production of various devices through use of the semiconductor substrate, the substrate cannot be fixed by adsorption in a process apparatus or on a conveying device, and hence a production failure due to, for example, the falling of the substrate may occur.

It is easy to visually distinguish the main surface and the back surface from each other in the Group-III element nitride semiconductor substrate according to the embodiment of the present invention, and hence there is no need to form a secondary orientation flat. Thus, a large effective area (area that can be used in device production) of the semiconductor substrate can be secured. That is, the Group-III element nitride semiconductor substrate according to the embodiment of the present invention is preferably free of any secondary orientation flat.

Figure 3:
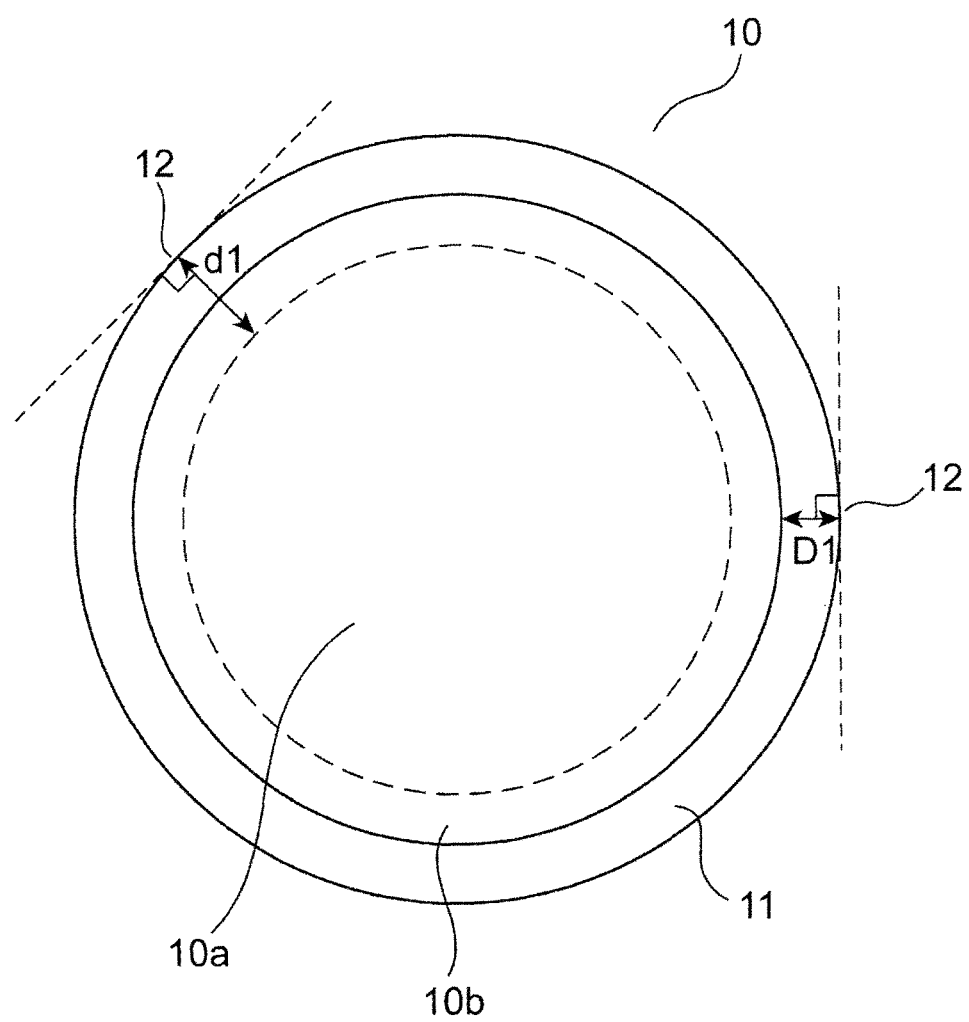
FIG. 3 is a schematic plan view viewed from the main surface direction of the Group-III element nitride semiconductor substrate according to the embodiment of the present invention.

FIG. 3 is a schematic plan view viewed from the main surface direction of the Group-III element nitride semiconductor substrate according to the embodiment of the present invention.

As illustrated in FIG. 3, the main surface-side chamfered portion 11 may be arranged in the main surface. The main surface-side chamfered portion 11 is typically a region arranged in the main-surface outer peripheral region 10b, the region ranging from an outer peripheral end portion 12 to a distance corresponding to a width D1 toward the inner direction of the main surface 10 over the entire periphery of the main-surface outer peripheral region. The width D1 of the main surface-side chamfered portion is a distance starting from the outer peripheral end portion 12, the distance being in a normal direction with respect to a tangent in the outer peripheral end portion 12 toward the inner direction of the main surface 10. The width D1 of the main surface-side chamfered portion is preferably constant in the entirety of the main surface-side chamfered portion 11.

Figure 4:
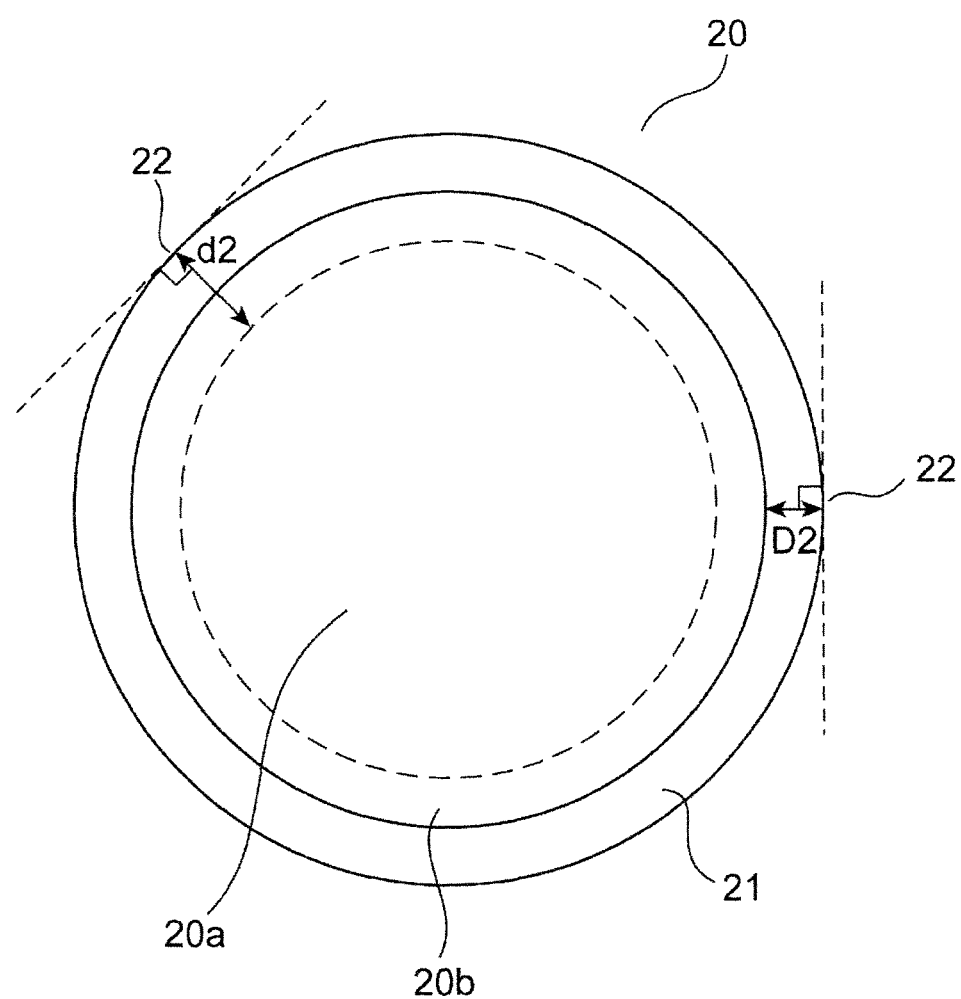
FIG. 4 is a schematic plan view viewed from the back surface direction of the Group-III element nitride semiconductor substrate according to the embodiment of the present invention.

FIG. 4 is a schematic plan view viewed from the back surface direction of the Group-III element nitride semiconductor substrate according to the embodiment of the present invention.

As illustrated in FIG. 4, the back surface-side chamfered portion 21 may be arranged in the back surface. The back surface-side chamfered portion 21 is typically a region arranged in the back-surface outer peripheral region 20b, the region ranging from an outer peripheral end portion 22 to a distance corresponding to a width D2 toward the inner direction of the back surface 20 over the entire periphery of the back-surface outer peripheral region. The width D2 of the back surface-side chamfered portion is a distance starting from the outer peripheral end portion 22, the distance being in a normal direction with respect to a tangent in the outer peripheral end portion 22 toward the inner direction of the back surface 20. The width D2 of the back surface-side chamfered portion is preferably constant in the entirety of the back surface-side chamfered portion 21.

As illustrated in FIG. 4, the back-surface outer peripheral region 20b is typically a region from the outer peripheral end portion 22 to a distance corresponding to a width d2 toward the inner direction of the back surface 20 when the back surface 20 is viewed from a surface direction. As illustrated in FIG. 4, the width d2 of the back-surface outer peripheral region is a distance starting from the outer peripheral end portion 22, the distance being in a normal direction with respect to a tangent in the outer peripheral end portion 22 toward the inner direction of the back surface 20. The width d2 of the back-surface outer peripheral region is preferably constant over the entirety of the back-surface outer peripheral region 20b.

Any appropriate size may be adopted as the width d2 of the back-surface outer peripheral region in accordance with, for example, the size of the Group-III element nitride semiconductor substrate according to the embodiment of the present invention to the extent that the effects of the present invention are not impaired. The width d2 of the back-surface outer peripheral region is preferably 5 mm or less, more preferably 3 mm or less, still more preferably 1 mm or less because the effect of the present invention can be expressed to a larger extent. The lower limit value of the width d2 of the back-surface outer peripheral region is preferably 0.2 mm or more, more preferably 0.5 mm or more because the effect of the present invention can be expressed to a larger extent.

In the Group-III element nitride semiconductor substrate according to the embodiment of the present invention, the back surface-side chamfered portion may coincide with the back-surface outer peripheral region of the back surface. For example, in FIG. 4, the back surface-side chamfered portion 21 may coincide with the back-surface outer peripheral region 20b. In this case, in FIG. 4, the width D2 of the back surface-side chamfered portion coincides with the width d2 of the back-surface outer peripheral region.

In the Group-III element nitride semiconductor substrate according to the embodiment of the present invention, the back-surface outer peripheral region 20b is preferably a light-shielding region configured to attenuate laser light having a wavelength of from 450 nm to 1,100 nm. When the back-surface outer peripheral region 20b is a light-shielding region configured to attenuate the laser light having a wavelength of from 450 nm to 1,100 nm, it may become easy to visually distinguish the main surface and back surface of the substrate from each other, and the end portion thereof can be easily detected with an optical sensor. In the Group-III element nitride semiconductor substrate according to the embodiment of the present invention, the back-surface outer peripheral region 20b is more preferably a light-shielding region configured to attenuate laser light having a wavelength of 650 nm by 10% or more.

The warping of the Group-III element nitride semiconductor substrate according to the embodiment of the present invention is preferably 50 μm or less. The measurement of the warping is described later.

The radius of curvature of the Group-III element nitride semiconductor substrate according to the embodiment of the present invention is preferably 30 m or more, more preferably 40 m or more, still more preferably 50 m or more. The measurement of the radius of curvature is described later.

The Group-III element nitride semiconductor substrate according to the embodiment of the present invention may be produced by any appropriate method to the extent that the effects of the present invention are not impaired.

Figure 5A:
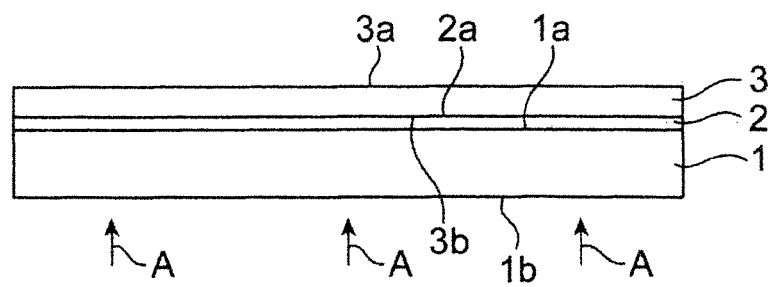
Figure 5B:
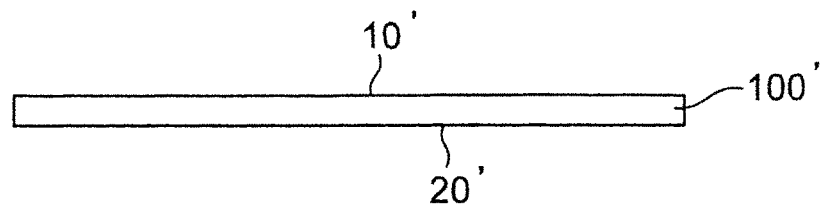

In the Group-III element nitride semiconductor substrate according to the embodiment of the present invention, typically, as illustrated in FIG. 5(A), a seed crystal film 2 is formed on the main surface 1a of a base substrate 1, and a Group-III element nitride layer 3 is formed on the Group-III element polar surface 2a of the seed crystal film 2. Next, a Group-III element nitride layer (seed crystal film 2+Group-III element nitride layer 3) serving as a freestanding substrate is separated from the base substrate 1 to provide a freestanding substrate 100' having a main surface 10' and a back surface 20'. The freestanding substrate 100' may be obtained as illustrated in FIG. 5(B) through the separation of the Group-III element nitride layer by a laser lift-off method including applying laser light from the back surface 1b side of the base substrate 1 as indicated by the arrows A, or the freestanding substrate 100' may be obtained by a spontaneous separation method including utilizing a thermal shrinkage difference at the time of a temperature decrease after the formation of the Group-III element nitride layer 3, or by slicing the Group-III element nitride layer 3 with a wire saw or the like.

Any appropriate material may be adopted as a material for the base substrate to the extent that the effects of the present invention are not impaired. Examples of such material include sapphire, crystal-oriented alumina, gallium oxide, $Al_xGa_{1-x}N$ (0≤x≤1), GaAs, and SiC.

Any appropriate material may be adopted as a material for the seed crystal film to the extent that the effects of the present invention are not impaired. Examples of such material include $Al_xGa_{1-x}N$ (0≤x≤1) and $In_xGa_{1-x}N$ (0≤x≤1). Of those, gallium nitride is preferred. The material for the seed crystal film is more preferably gallium nitride that is recognized to show a yellow luminescence effect when observed with a fluorescence microscope. The term "yellow luminescence" refers to a peak (yellow luminescence (YL) or a yellow band (YB)) appearing in the range of from 2.2 eV to 2.5 eV in addition to an exciton transition (UV) from a band to another band.

Any appropriate formation method may be adopted as a method of forming the seed crystal film to the extent that the effects of the present invention are not impaired. Such formation method is, for example, a vapor growth method, and preferred examples thereof include a metal organic chemical vapor deposition (MOCVD) method, a hydride vapor phase epitaxy (HVPE) method, a pulsed excitation deposition (PXD) method, a molecular beam epitaxy (MBE) method, and a sublimation method. Of those, a metal organic chemical vapor deposition (MOCVD) method is more preferred as the method of forming the seed crystal film. A growth temperature is preferably from 950° C. to 1,200° C.

Any appropriate growth direction may be adopted as the growth direction of the Group-III element nitride crystal to the extent that the effects of the present invention are not impaired. Examples of such growth direction include: the normal direction of the c-plane of a wurtzite structure; the normal direction of each of the a-plane and m-plane thereof; and the normal direction of a plane tilted from each of the c-plane, the a-plane, and the m-plane.

Any appropriate production method may be adopted as a method of producing the Group-III element nitride layer to the extent that the effects of the present invention are not impaired. Examples of such production method include: gas phase methods, such as a metal organic chemical vapor deposition (MOCVD) method, a hydride vapor phase epitaxy (HVPE) method, a pulsed excitation deposition (PXD) method, a molecular beam epitaxy (MBE) method, and a sublimation method; and liquid phase methods, such as an ammonothermal method and a flux method.

Next, the freestanding substrate is shaped into a circular shape having a desired diameter by grinding its outer peripheral portion.

Any appropriate size may be adopted as the size of the freestanding substrate to the extent that the effects of the present invention are not impaired. Such size is, for example, 25 mm (about 1 inch), from 45 mm to 55 mm (about 2 inches), from 95 mm to 105 mm (about 4 inches), from 145 mm to 155 mm (about 6 inches), from 195 mm to 205 mm (about 8 inches), or from 295 mm to 305 mm (about 12 inches).

Next, the nitrogen polar surface of the circular freestanding substrate is bonded to a surface plate for processing. At the time of the bonding, the surface shape of the freestanding substrate is changed by changing the thickness of a wax through the adjustment of a load to be applied to the freestanding substrate, or by interposing a jig between the freestanding substrate and the surface plate for processing.

Next, the freestanding substrate is turned into a thin plate having a desired thickness, and the surface of the Group-III element polar surface is flattened, through the removal processing of the Group-III element polar surface by grinding, lapping, polishing, or the like. Thus, a freestanding substrate in which the Group-III element polar surface is turned into a mirror surface is obtained.

Next, the Group-III element polar surface of the freestanding substrate in which the Group-III element polar surface is turned into a mirror surface is bonded to a surface plate for processing. At the time of the bonding, the surface shape of the freestanding substrate is changed by changing the thickness of a wax through the adjustment of a load to be applied to the freestanding substrate, or by interposing a jig between the freestanding substrate and the surface plate for processing.

Next, the freestanding substrate is turned into a thin plate having a desired thickness, and the surface of the nitrogen polar surface is flattened, through the removal processing of the nitrogen polar surface by grinding, lapping, polishing, or the like. Thus, a freestanding substrate in which the nitrogen polar surface is turned into a mirror surface is obtained. In this embodiment, the nitrogen polar surface is subjected to mirror finish after the Group-III element polar surface has been subjected to mirror finish. However, the order may be reverse to the foregoing.

The thickness of the freestanding substrate after the polishing (when the thickness is not constant, the thickness of a site having the largest thickness) is preferably from 300 µm to 1,000 µm.

Next, the outer peripheral edge of the freestanding substrate is chamfered by grinding. Finally, the Group-III element nitride semiconductor substrate 100 according to the embodiment of the present invention is obtained.

In the Group-III element nitride semiconductor substrate according to the embodiment of the present invention, the chamfering may be performed by any appropriate chamfering method to the extent that the effects of the present invention are not impaired. Examples of such chamfering method include: grinding with diamond abrasive grains; polishing with a tape; and chemical mechanical polish (CMP) with a slurry such as colloidal silica and a polishing pad made of a nonwoven fabric.

Next, the outer peripheral portion of the nitrogen polar surface is subjected to surface-roughening processing. Finally, the Group-III element nitride semiconductor substrate 100 according to the embodiment of the present invention is obtained.

Any appropriate method may be adopted as a method for the surface-roughening processing to the extent that the effects of the present invention are not impaired. Examples of such method include: laser texture processing; etching treatment including using various chemicals and gases; physical or chemical coating treatment; and texturing by machining.

Figure 5C:
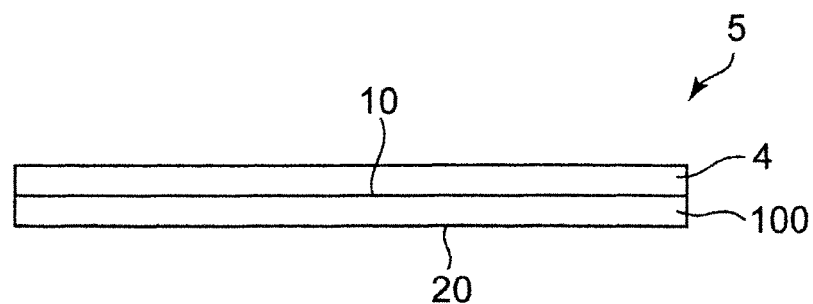

A crystal can be epitaxially grown on the main surface (Group-III element polar surface) 10 of the Group-III element nitride semiconductor substrate 100 to be obtained, and the formation of a functional layer 4 as illustrated in FIG. 5(C) provides a functional element 5. Reference numeral 20 represents the back surface (nitrogen polar surface) of the substrate.

When the warping of the main surface (Group-III element polar surface) and the warping of the back surface (nitrogen polar surface) differ from each other, the total thickness variation (TTV) of the freestanding substrate occurs. However, even when the total thickness variation of the freestanding substrate occurs, no large variation occurs on the main surface (Group-III element polar surface) at the time of the epitaxial growth of the functional layer on the freestanding substrate. This is because the following property is utilized: the thermal conductivity of the Group-III element nitride crystal for constituting the freestanding substrate is high. As a result, morphology abnormality at the time of the formation of the functional layer does not occur, and hence the shift of the luminous wavelength of the layer and variations in voltage-current characteristics thereof can be sufficiently suppressed.

The epitaxial crystal to be grown on the Group-III element nitride semiconductor substrate to be obtained may be, for example, gallium nitride, aluminum nitride, indium nitride, or a mixed crystal thereof. Specific examples of such epitaxial crystal include GaN, AlN, InN, $(1>x>0)$, $Ga_xIn_{1-x}N$ $(1>x>0)$, $Al_xIn_{1-x}N$ $(1>x>0)$, and $Ga_xAl_yIn_zN$ $(1>x>0, 1>y>0, x+y+z=1)$. In addition, examples of the functional layer to be arranged on the Group-III element nitride semiconductor substrate to be obtained include a rectifying element layer, a switching element, and a power semiconductor layer in addition to a light-emitting layer. In addition, the thickness and total thickness variation of the freestanding substrate may be reduced by subjecting the nitrogen polar surface to processing, such as grinding or polishing, after the arrangement of the functional layer on the Group-III element polar surface of the Group-III element nitride semiconductor substrate to be obtained.

EXAMPLES

The present invention is specifically described below by way of Examples. However, the present invention is by no means limited to Examples. Test and evaluation methods in Examples and the like are as described below. The term "part(s)" in the following description means "part(s) by weight" unless otherwise specified, and the term "%" in the following description means "wt %" unless otherwise specified.

<Measurement of Surface Roughness Ra>

The surface roughness (arithmetic average roughness) Ra of the surface of a Group-III element nitride semiconductor freestanding substrate was calculated with a non-contact surface shape-measuring machine (manufactured by Zygo Corporation, New View 7000, objective lens: ×5, software: MetroPro 9.0.10) in an observation field of view measuring 1.4 mm by 1.05 mm. The Ra of each of the main surface and back-surface central region of the substrate was measured at the central portion of the substrate, and when the width of the back-surface outer peripheral region thereof was represented by d2, the Ra of the back-surface outer peripheral region was measured at a position corresponding to a distance of d2/2 from a boundary between the back-surface central region and the back-surface outer peripheral region. When the width d2 of the back-surface outer peripheral region was narrower than the observation field of view measuring 1.4 mm by 1.05 mm, the measurement was performed while the observation field of view was appropriately narrowed.

<Evaluation Criteria of Visual Distinction Between Main Surface and Back Surface>

The main surface and back surface of a wafer were visually distinguished from each other by using a white fluorescent lamp as a light source in a room having an illuminance of from 817 LX to 893 LX. YOKOGAWA 510LUX METER was used as an illuminometer. A surface whose entirety was uniformly a mirror surface was defined as the main surface, and a surface whose outer peripheral portion was not a mirror surface was defined as the back surface. A case in which the distinction was able to be performed without any particular gaze was judged to be to "easy", a case in which the distinction was able to be performed with a gaze was judged to be to "possible", and a case in which clear distinction could not be performed even with a gaze was judged to be to "difficult". The phrase "with a gaze" as used herein means that the main surface and the back surface are observed over a time period of 10 seconds or more while an observation angle is changed.

<Evaluation Criteria of Detection of End Portion with Optical Sensor>

A test for the detection of the end portion of a substrate was performed with a transmission photoelectric sensor. ZX-GT28S (wavelength: 650 nm) manufactured by OMRON Corporation was used as a light source and a detector, and an attenuation ratio at a wavelength of 650 nm was evaluated while the binarization level of a measured value was set to 50%. A laser intensity enabling the transmission photoelectric sensor to detect an edge was identified with a laser power sensor (manufactured by Ophir Optronics Solutions, Inc., 3A).

○: Laser light having a wavelength of 650 nm can be attenuated by 10% or more (sensor judgment: acceptable).

×: Laser light having a wavelength of 650 nm cannot be attenuated by 10% or more (sensor judgment: unacceptable).

<Measurement of Warping>

The warping of the main surface of a substrate was measured, and the radius of curvature thereof was calculated from the warping. The warping may be measured with a laser displacement meter. The term "laser displacement meter" refers to an apparatus for measuring the displacement of each surface by irradiating the surface with laser light. The wavelength of the laser light is set to 655 nm, and a confocal system, a triangular ranging system, or an optical interference system may be used as a measurement system in accordance with the surface roughness of the substrate.

A waveform was obtained except for a range having a width of 3 mm from the end of the substrate. Next, a curve approximate to the waveform was obtained by a least-squares method including using a quadratic function. A difference between the maximum value and minimum value of the approximate curve was measured on each of two axes perpendicular to each other on the surface of the substrate, and the average of the two values was defined as a warping S. In addition, a radius of curvature R was calculated from the warping value through use of the following equation. The diameter of the substrate is represented by D.

$$R=D^2/(8\cdot S)$$

where the radius of curvature R, the substrate diameter D, and the warping S are represented in the unit of [m].

Example 1

A gallium nitride film having a thickness of 2 μm was formed on a 6-inch c-plane sapphire wafer by a MOCVD method to produce a seed crystal substrate.

The seed crystal substrate was arranged in an alumina crucible having a diameter of 200 mm in a glove box under a nitrogen atmosphere. Next, metal gallium and metal sodium were loaded into the crucible so that the following ratio was obtained, followed by the lidding of the crucible with an alumina plate: Ga/Ga+Na (mol %)=15 mol %. The crucible was loaded into a stainless steel-made inner vessel, and the vessel was further loaded into a stainless steel-made outer vessel capable of storing the vessel, followed by the closing of the outer vessel with a vessel lid mounted with a nitrogen-introducing pipe. The outer vessel was arranged on a rotary table placed in a heating portion in a crystal-producing apparatus that had been baked in a vacuum in advance, and the pressure-resistant vessel of the apparatus was lidded and hermetically sealed.

Next, the inside of the pressure-resistant vessel was evacuated to a vacuum of 0.1 Pa or less with a vacuum pump. Subsequently, while an upper heater, a middle heater, and a lower heater were regulated to heat a heating space so that its temperature became 870° C., a nitrogen gas was introduced from a nitrogen gas bomb into the pressure-resistant vessel until a pressure therein became 4.0 MPa, and the outer vessel was rotated about its central axis at a speed of 20 rpm clockwise and counterclockwise at a certain period. Then, the outer vessel was held under the state for 40 hours. After that, the temperature was naturally cooled to room temperature, and the pressure was reduced to atmospheric pressure. After that, the lid of the pressure-resistant vessel was opened, and the crucible was removed from its inside. Solidified metal sodium in the crucible was removed, and a gallium nitride crystal grown on the seed crystal substrate was recovered.

UV laser light was applied from a sapphire wafer side to decompose the gallium nitride crystal on the seed crystal substrate. Thus, the grown gallium nitride crystal was separated from the sapphire wafer. The warping of the gallium nitride crystal obtained by the separation was 50 μm.

The outer peripheral portion of the gallium nitride crystal was ground with diamond abrasive grains so that the diameter thereof was adjusted to 150 mm.

Next, the gallium nitride crystal was bonded to a ceramic-made surface plate for processing, and the Ga polar surface thereof was ground and polished with a grinder and a lapping apparatus. The resultant surface was subjected to mirror finish serving as final finish with diamond abrasive grains each having a grain diameter of 0.1 μm.

The gallium nitride crystal was reversed and fixed to the ceramic-made surface plate for processing, and the nitrogen polar surface thereof was similarly ground and polished. The resultant surface was subjected to mirror finish serving as final finish with diamond abrasive grains each having a grain diameter of 0.1 μm.

A protective material was applied to each of the front and back surfaces of the gallium nitride crystal, and the outer peripheral portion of the wafer was molded with a beveling apparatus. The Ga polar surface was chamfered with tilted abrasive grains (tilt angle: 20°). The chamfering width D1 of the plane was set to 150 μm. The nitrogen polar surface was subjected to outer periphery surface-roughening processing by laser texture processing. An uneven shape was formed in the outer peripheral portion of the nitrogen polar surface with a UV laser having a wavelength of 355 nm and an output of 3 W by applying laser light condensed into a diameter of 70 μm to the portion while scanning the light. The range d2 of the surface-roughening processing was set to 3 mm from the outer periphery of the nitrogen polar surface.

The front and back surfaces of the resultant Group-III element nitride semiconductor wafer were able to be visually distinguished from each other with ease. In addition, the warping of the wafer was 40 μm.

The results are shown in Table 1.

Example 2

A Group-III element nitride semiconductor wafer was produced in the same manner as in Example 1 except that the range d2 of the back surface-roughening processing was set to mm from the outer periphery. The front and back surfaces of the resultant Group-III element nitride semiconductor wafer were able to be visually distinguished from each other with ease. In addition, the warping of the wafer was 48 μm.

The results are shown in Table 1.

Example 3

A Group-III element nitride semiconductor wafer was produced in the same manner as in Example 1 except that the range d2 of the back surface-roughening processing was set to 1 mm from the outer periphery. The front and back surfaces of the resultant Group-III element nitride semiconductor wafer were able to be visually distinguished from each other. In addition, the warping of the wafer was 28 μm.

The results are shown in Table 1.

Comparative Example 1

A Group-III element nitride semiconductor wafer was produced in the same manner as in Example 1 except that the entire surface of the back surface was subjected to rough finish. The front and back surfaces of the resultant Group-III element nitride semiconductor wafer were able to be visually distinguished from each other with ease. In addition, the warping of the wafer was 105 μm.

The results are shown in Table 1.

Comparative Example 2

A Group-III element nitride semiconductor wafer was produced in the same manner as in Example 1 except that the range d2 of the back surface-roughening processing was set to 10 mm from the outer periphery. The front and back surfaces of the resultant Group-III element nitride semiconductor wafer were able to be visually distinguished from each other with ease. In addition, the warping of the wafer was 59 μm.

The results are shown in Table 1.

Comparative Example 3

A Group-III element nitride semiconductor wafer was produced in the same manner as in Example 1 except that the entire surface of the back surface was subjected to mirror surface finish. The front and back surfaces of the resultant Group-III element nitride semiconductor wafer could not be visually distinguished from each other. In addition, the warping of the wafer was 21 µm.

The results are shown in Table 1.

TABLE 1

| | Width of outer peripheral region of back surface (mm) | Visual distinction between main surface and back surface | Detection of end portion with optical sensor | Warping (µm) | Radius of curvature (m) |
|---|---|---|---|---|---|
| Example 1 | 3 | Easy | ○ | 40 | 70 |
| Example 2 | 5 | Easy | ○ | 48 | 59 |
| Example 3 | 1 | Possible | ○ | 28 | 100 |
| Comparative Example 1 | None | Easy | ○ | 105 | 27 |
| Comparative Example 2 | 10 | Easy | ○ | 59 | 48 |
| Comparative Example 3 | None | Difficult | x | 21 | 134 |

The Group-III element nitride semiconductor substrate according to the embodiment of the present invention may be utilized as each of the substrates of various semiconductor devices.

According to the present invention, such Group-III element nitride semiconductor substrate including the first surface and the second surface that it is easy to visually distinguish the first surface and the second surface from each other, that an end portion is easily detected with an optical sensor, that a large effective area can be secured, and that the warping of the entirety of the substrate is reduced can be provided.

Many other modifications will be apparent to and be readily practiced by those skilled in the art without departing from the scope and spirit of the invention. It should therefore be understood that the scope of the appended claims is not intended to be limited by the details of the description but should rather be broadly construed.

What is claimed is:

1. A Group-III element nitride semiconductor substrate, comprising:
   a first surface; and
   a second surface,
   wherein the first surface is a minor surface,
   wherein the second surface has a second-surface central region and a second-surface outer peripheral region,
   wherein the second-surface central region is a minor surface,
   wherein the second-surface outer peripheral region is a non-mirror surface, and
   wherein the first surface has a surface roughness Ra of 1 nm or less,
   wherein the second-surface outer peripheral region has a width of 1 mm or less.

2. The Group-III element nitride semiconductor substrate according to claim 1, wherein the second-surface outer peripheral region has a surface roughness Ra of 100 nm or more.

3. The Group-III element nitride semiconductor substrate according to claim 2, wherein the second-surface central region has a surface roughness Ra of 10 nm or less.

4. The Group-III element nitride semiconductor substrate according to claim 1, wherein the second-surface outer peripheral region is a light-shielding region configured to attenuate laser light having a wavelength of 650 nm by 10% or more.

5. The Group-III element nitride semiconductor substrate according to claim 1, wherein the substrate has a warping of 50 µm or less.

6. The Group-III element nitride semiconductor substrate according to claim 1, wherein the substrate has a radius of curvature of 30 m or more.

7. The Group-III element nitride semiconductor substrate according to claim 1, wherein the substrate is free of any secondary orientation flat.

8. The Group-III element nitride semiconductor substrate according to claim 1, wherein the substrate has a diameter of 95 mm or more.

9. The Group-III element nitride semiconductor substrate according to claim 8, wherein the substrate has a diameter of 145 mm or more.

* * * * *